United States Patent [19]

Eldin et al.

[11] Patent Number: 4,791,611
[45] Date of Patent: Dec. 13, 1988

[54] VLSI DYNAMIC MEMORY

[75] Inventors: Ali G. Eldin; Mohammed I. Elmasry, both of Waterloo, Canada

[73] Assignee: University of Waterloo, Waterloo, Ontario, Canada

[21] Appl. No.: 774,981

[22] Filed: Sep. 11, 1985

[51] Int. Cl.⁴ .................. G11C 11/34; H01L 29/80
[52] U.S. Cl. ........................................ 365/177; 357/22
[58] Field of Search .............. 365/149, 150, 174, 177; 357/23.6, 22

[56] References Cited

U.S. PATENT DOCUMENTS 4,090,254  5/1978  Ho et al. .................. 365/150

OTHER PUBLICATIONS

R. A. Carballo et al., "High Performance/Density Dynamic RAM Cell", IBM Technical Disclosure Bulletin, vol. 26, No. 7A, Dec. 1983, pp. 3227-3228.

Primary Examiner—Joseph A. Popek
Attorney, Agent, or Firm—Anthony Asquith & Co.

[57] ABSTRACT

The disclosed chip is suitable for VLSI dRAMS. The memory cell includes a bipolar transistor, a JFET, and a capacitor. The capacitor comprises a MOSFET which is operated only in the accumulation mode. Each cell requires only three lines. On a p-substrate, which comprises the collector of the bipolar, the cell layers are:- an n-well which comprises the channel of the JFET and the base of the bipolar; a p-region, which comprises the gate of the JFET, the emitter of the bipolar, and the bottom plate of the capacitor; an oxide layer; and a conducting layer; arranged as a vertical stack in that order. The latter two layers are the insulator and the top plate of the capacitor. The source and drain of the JFET are respective n+ regions placed one either side of the stack. The n-well can be deep and hence can be compatible with conventional CMOS technology. The chip has full read, write, and refresh capability; is relatively easily manufactured; and can be considerably scaled down without losing performance.

22 Claims, 3 Drawing Sheets

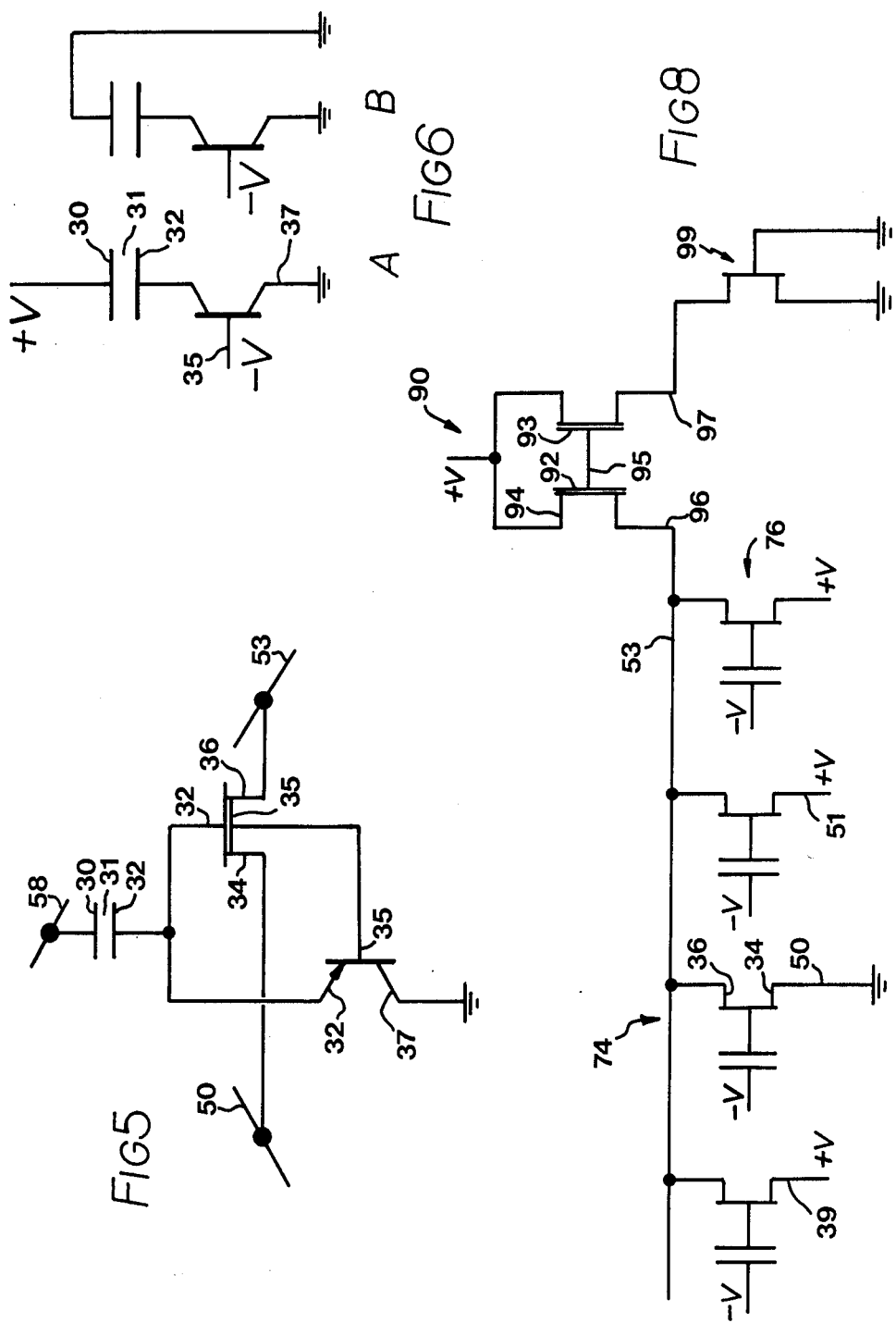

VLSI DYNAMIC MEMORY

This invention relates to monolithic integrated circuit chips, and in particular to a way of structuring memory cells on such chips.

The chip of the invention is particularly suited to the very large scale integration (VLSI) of dynamic random access memory (dRAM) cells.

When designing a monolithic chip, the designer must have the following points in mind:

Whatever the design of the cell, it is practical to provide three lines or conductors to each memory cell; but a cell design that requires more than three lines will be at an immediate disadvantage. For example, it can be arranged that two of these lines are parallel and run along the columns of the memory cells, these lines being termed the READ BIT-LINEs and the WRITE BIT-LINEs. The other lines of the three are the WORD-LINEs, which run along the rows of the memory cells, i.e. at right angles to the BIT-LINEs. Depending on the cell design, however, other arrangements of the three lines may be more appropriate.

The design of the memory cell is not an isolated activity, but one that has to be done in full knowledge of the manner in which these lines can be controlled and accessed. For instance, the kinds of voltages that are applied to each line must be compatible with the kinds of voltages that can be produced on the chip itself. The design must be such that the chip does not require outside access to each line individually.

In the invention, each individual memory cell is designed to be supplied with both positive and negative (and also ground) voltages. If the voltages that are to be directed down the various lines are to be sometimes negative and sometimes positive, and if the chip is to be reasonably easy to manufacture and reliable in operation, then it is desirable for the chip to be made using CMOS technology. The basis of CMOS technology is that complementary transistors are produced on a uniformly-doped substrate. It may be observed that many kinds of recently proposed VLSI cells would require the chips to be manufactured in a far more sophisticated manner than has been possible hitherto.

In the invention, the layout of the individual memory cells is such that the chip as a whole can include complementary transistors formed on the common substrate, without any such problems. The memory cell of the invention does have to be supplied with both positive and negative voltages, but the design of the chip as a whole is such that simple CMOS technology can be used to produce those positive and negative voltages.

The invention will be described first with the aid of the accompanying drawings in which:

FIG. 5 is a diagram of the equivalent electrical circuit of the cell;

FIGS. 6a & 6b are diagrams of part of the circuit, shown in different conditions;

FIG. 8 is a circuit diagram illustrating the operation of a sense-amplifier;

Figure 3:
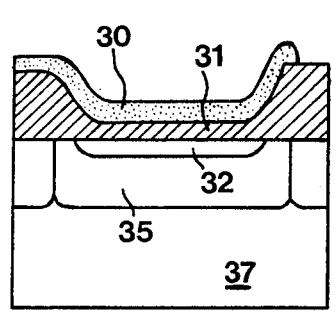
FIGS. 3 & 4 are cross-sections on the lines 3—3 and 4—4 of FIG. 2.
Figure 2:
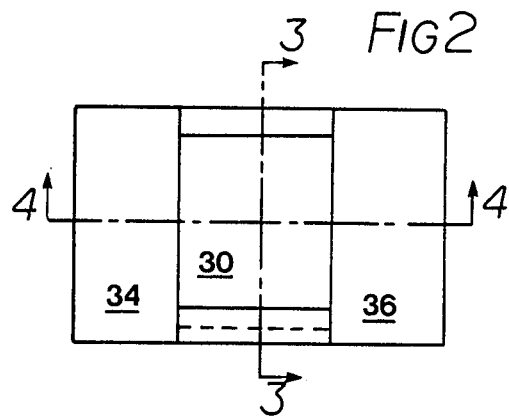
FIG. 2 is a plan view of the cell.
Figure 4:
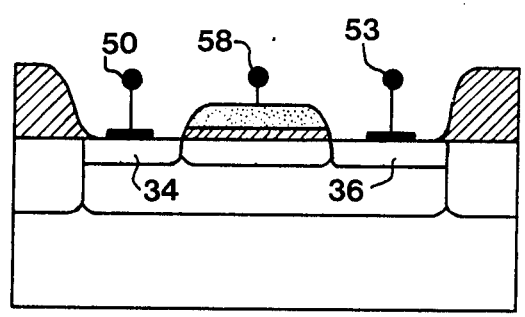
Figure 1:
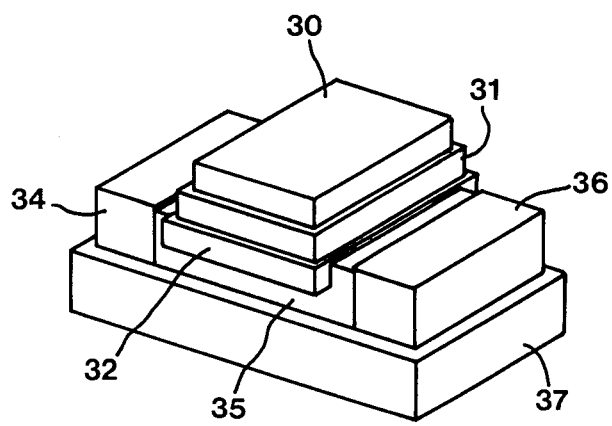
FIG. 1 is a diagrammatic illustrative view of a memory cell.

FIG. 1 shows, in a diagrammatic manner, how the cell of the invention is constructed. 37 is a substrate of p-doped semiconductor material. Two heavily n-doped regions 34, 36 are diffused onto the substrate 37. A layer 35 of n-doped material straddles the regions 34, 36, and a layer 32 of p-doped material surmounts the layer 35.

The regions 34, 36 make up the source and drain, the layer 35 makes up the channel, and the layer 32 makes up the gate, of an n-type junction-gate field effect transistor (nJFET). Equally, the p-layer 32, the n-layer 34, and the substrate make up the emitter, base and collector respectively of a p-n-p bipolar transistor.

Formed on top of the p-layer 32 is an insulating layer 31, of silicon dioxide, and on top of that in turn is a conducting layer 30, formed of polysilicon.

The conductor 30, the insulator 31, the p-layer 32, and the regions 34, 36 can be regarded, physically, as an insulated gate field-effect transistor (IGFET), of the metal-oxide-semiconductor (MOSFET) kind. It has become the trend, the expression "metal" in a MOSFET is now figurative, the conductor actually being polysilicon.

The MOSFET transistor will never be forward biassed during the operation of the chip, so the structure never actually acts as a full MOSFET. The structure instead acts to provide storage capacitance in the cell. It will be noted, however, that the electrical substrate of the MOSFET, i.e. the p-layer 32, serves not only as one plate of the capacitor, but also as the gate of the JFET and also as the emitter of the bipolar transistor. Similarly, the n-layer 35 serves as both the channel of the JFET and as the base of the bipolar transistor.

As mentioned, the gate of the MOSFET never goes positive, though it can be at either a negative or ground voltage. The MOS capacitor can be charged by putting a negative voltage into the gate 30, and discharged by putting ground voltage into the gate 30, as will be described presently. Whether the cell is storing a logic "1" or "0" depends on whether the capacitor is charged or discharged.

FIGS. 1 to 4 show the physical arrangement of the cell. FIG. 5 shows the equivalent circuit, or lumped component model.

WRITING

The following procedure is used to charge the capacitor, i.e. to WRITE logic "1" into the cell. In the procedure, the drain 36 is connected to a positive voltage, and the p-substrate 37 is grounded. The source 34 is at a negative voltage, which is effective to enable the bipolar transistor, i.e. to allow the bipolar transistor to conduct a current between its emitter 32 and its collector 37.

If, at this point, the gate 30 is given a negative voltage, the capacitor will take on a charge, i.e. the bottom plate 32 will be at zero (ground) voltage, and the top plate 30 will be at the negative voltage. This happens whether or not there was already a charge in the capacitor. Hence the cell will then be in logic state "1".

If, on the other hand, the gate 30 is connected to ground, then both plates 30, 32 will be at zero (ground) voltage, i.e. it is as if they are connected together, and any charge that was present in the capacitor will therefore be discharged. Hence the cell will then be in logic state "0".

FIG. 6 shows the equivalent circuit diagram when WRITING a "1" (FIG. 6a) or a "0" (FIG. 6b) into the cell.

It will be noted that a number of conditions have to be fulfilled before WRITING can take place:

(a) WRITING will not take place unless the bipolar transistor of the cell is forward-biassed, because if the bipolar transistor were not forward-biassed, there would then be no current path between the bottom plate 32 of the capacitor and around. When it is required to avoid WRITING into the cell, the source-region 34 may in order to prevent WRITING therefore, be placed at positive voltage. The charged or discharged state of the capacitor will then remain, irrespective of whether the voltage of the gate 30 is zero or negative.

(b) The other condition for WRITING to take place is that the appropriate voltage (i.e. either zero or negative) must be applied to the gate 32. It will be noted that whenever tne source 34 goes negative—the drain 36 being positive—then WRITING must take place, in accordance with whether there is a zero or a negative voltage on the gate 30.

It will now be described how these characteristics of the cell can be manipulated for the purpose of WRITING into a selected one of the cells.

Figure 7:
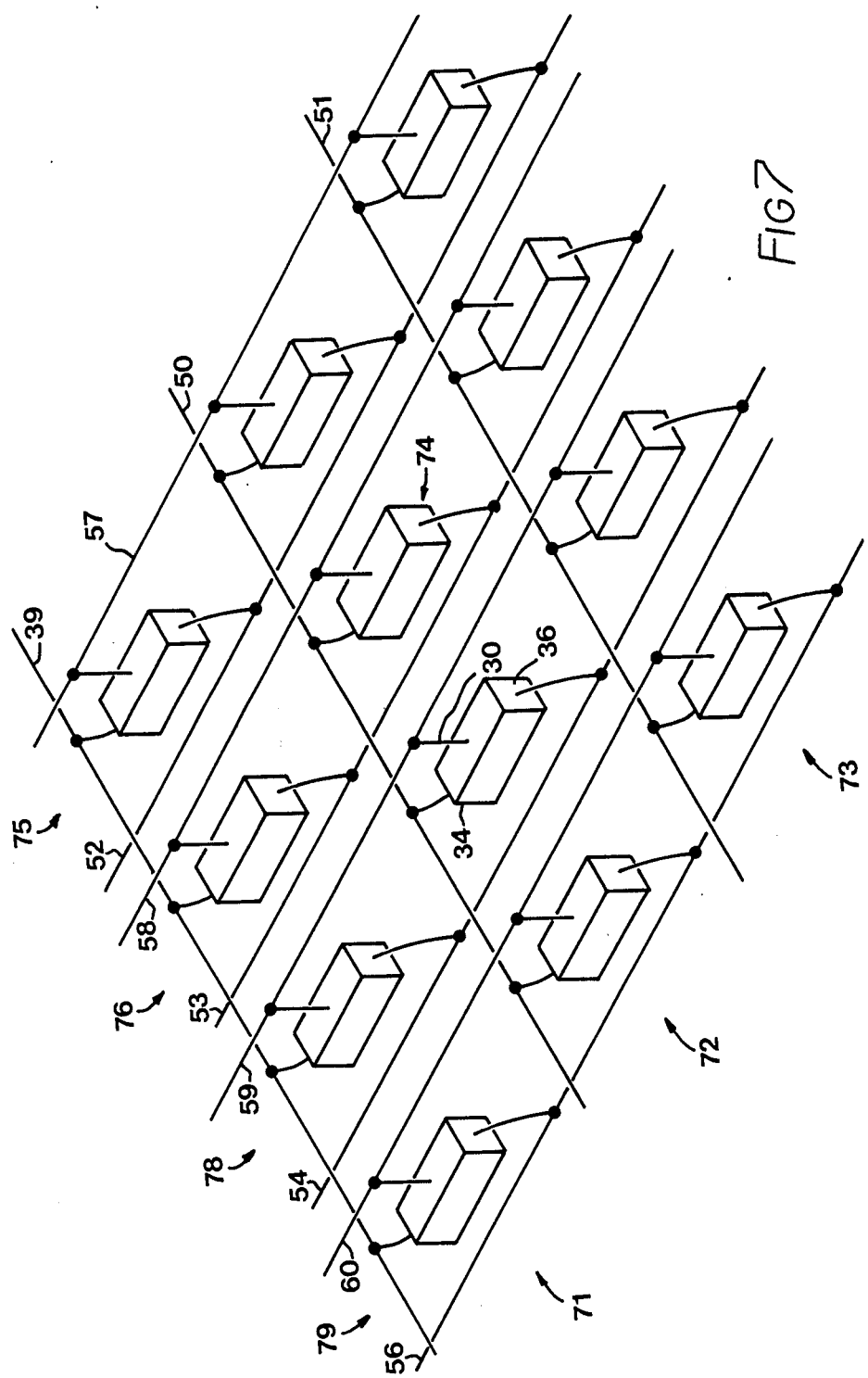
FIG. 7 is a diagrammatic illustrative view of a section of a chip, showing a number of cells, and some of the lines and associated circuit components.

The cells are arranged in rows 71, 72, 73 and columns 75, 76, 78, 79 as shown in FIG. 7. WORD-LINEs 39, 50, 51 run along the rows and are connected to the respective sources 34 as shown. READ BIT-LINEs 52, 53, 54, 56 run along the columns and are connected to the respective drains 36 of the cells. WRITE BIT-LINEs 57, 58, 59, 60 also run along the columns and are connected to the respective gates 30.

To WRITE into one of the cells 74 in the row 72, it will be necessary to set the source 34 of that cell 74 to a negative voltage. This is done by applying the required negative voltage to the WORD-LINE 50. However, since the WORD-LINE 50 is at negative voltage, not only will the selected cell 74 be open for WRITING, but every other cell in the same row 72 will also be open for WRITING. That is, the capacitor in each cell will become charged or discharged depending on whether the WRITE BIT-LINE 57, 58, 59, 60 of that particular cell is at zero or negative voltage. Therefore, to carry out a WRITE operation on the selected cell 74, it is necessary to set the voltage level of each one of the WRITE BIT-LINEs 57, 58, 59, 60 and not just that of the WRITE BIT-LINE 58 of the selected cell.

Therefore it is arranged that prior to a WRITE operation, a READ operation takes place. Or rather, it is arranged that the first stage of the READ operation, termed the SENSE operation takes place. The existing logic level of each cell in the row 72 is routed into a sensing means. There, the one logic level that corresponds to the selected cell 74 is altered (or confirmed) in accordance with instructions from outside the chip. After this, the sensing means contains all the updated data of the whole row 72. The data can then be WRITTEN back along the WRITE BIT-LINEs into the selected row 72, on condition, of course, that the selected row 72 is the only row that has the sources 34 of its cells lowered to a negative voltage.

It can be arranged, if desired, to up-date the logic levels of many, or all, cells in the selected row 72 simultaneously. When the cells are arranged in 8-cell bytes, for example, it is better if the 8 cells of any one byte are all located in the same row.

READING

The following procedure is used to READ the logic state of a particular cell. The gate 30 according to the READ procedure is set at a negative voltage, say 2.5 volts. If the cell contains logic state "1" there will be a charge in the capacitor, the bottom plate 32 being at a more positive voltage than that of the top plate 30. The top plate 30 being at −2.5 Volts, the bottom plate 32 is therefore at zero volts, or thereabouts. As mentioned earlier, the p-layer 32 that comprises the bottom plate of the capacitor also comprises the gate of the JFET. Therefore, the gate 32 of the JFET for stored logic "1", is at zero volts. If, at this point, a voltage is applied relatively between the source 34 and drain 36, then a current will flow through the JFET, when the cell has logic state "1".

On the other hand, if the cell contains logic state "0" there will be no charge in the capacitor. Therefore, the p-layer 32 will be at the same potential as that to which the top-plate 30 has been set, namely −2.5 volts. Hence, the gate 32 of the JFET, for stored logic "0", is at −2.5 volts. No current will therefore flow through the JFET when the cell has logic state "0".

The sensing means, as mentioned above, comprises respective sense-amplifiers 90 which are provided, one to each READ BIT-LINE 52, 53, 54, 56. The schematic circuit diagram of the sense-amplifier is shown in FIG. 8. FIG. 8 also shows the relationship of the sense-amplifier 90 to the cells that are connected to the particular READ BIT-LINE, i.e. the cells in the column 76, which are the cells that all have their drains 36 connected to READ BIT-LINE 53.

The sense-amplifier 90 includes two FETs 92, 93, the drains 94 of which are coupled together, and supplied with a positive potential and the gates 95 of which are coupled together and grounded. The source 96 of one FET 92 is coupled to the respective READ BIT-LINE 53. The source 97 of the other FET 93 is coupled to a means for applying a reference voltage, which comprises a similar cell 99 with a grounded gate.

All the drains 36 of the cells in the column 76 are connected to the READ BIT-LINE 53, and hence to the sense-amplifier 90. In order that only the selected cell should be sensed by the sense-amplifier during a READ operation, the WORD-LINE 50 of the selected cell is the only WORD-LINE that is grounded. The other WORD-LINEs 39, 51 are all set to +2.5 volts.

It can now be seen how the setting of the JFET is used during the READ operation. If the JFET of the selected cell 74 is set to conduct, i.e. if the selected cell is at logic state "1", then the voltage at the point 96 in the sense-amplifier will fall. If the JFET of the selected cell 74 is set so as not to conduct, i.e. if the selected cell is at logic state "0", then during a READ operation, no current can pass through the JFET of the cell, and the voltage at the point 96 in the sense-amplifier will remain high.

All the other cells that are connected to the READ BIT-LINE 53 have their sources 34 raised to +2.5 volts, and therefore if the voltage at point 96 does go low, the selected cell 74, with its grounded source, is the only cell that can have caused that to happen. Similarly, if the voltage at point 96 goes high, that result can only have come about because the JFET in the selected cell 74 was not conducting. The drains 36 of the JFETs of the other cells on READ BIT-LINE 53 are all set at a positive voltage, and therefore, whether these other cells store logic "1" or logic "0", none of them could have accounted for the fall, if a fall occured, in the voltage at point 96. Equally, none of these cells could have caused the voltage at point 96 to go high, if it did go high, since the JFETs in the unselected cells on the same READ BIT-LINE are all pinched-off.

Thus during a READ operation the sense amplifier acts as a potential divider. A differential voltage is established across the sense-amplifier, its polarity being dependent on whether the capacitor in the selected cell was charged or was not charged.

The final stage of the READ operation is to transfer the information outside the chip. To do this the READ BIT-LINE and the means for applying the reference voltage are disconnected from the particular sense-amplifier, which is latched, and the data from the sense-amplifier is routed to the output buffer. It will be noted that the READ operation is not a destructive operation, in that the charged or discharged condition of the cell's capacitor remains intact after the READ.

REFRESH

The charge of the capacitor in the cell, if there is a charge, remains intact only for a few seconds. Hence the cell has to be refreshed from time to time; i.e. the cell is of the dynamic kind.

In a REFRESH operation, the data is first SENSED by the sense amplifier—on the chip—and the contents of the sense amplifier are then written back into the cells.

It will be noted that the above-described WRITE operation incidentally caused a REFRESH cycle to be carried out on all the unselected cells on the same row 72.

In the invention, the chip is REFRESHed row by row. First, the preliminary SENSE stage of the READ operation is carried out on the cells of one row, as described above, to feed the state of each cell in that row into its respective sense-amplifier. Then, the contents of the sense amplifiers are written back into the cells using the WRITE BIT-LINEs, again as described above.

These operations are carried out simultaneously on all the cells of a row.

The READ, WRITE, and REFRESH operations of the chip of the invention have now been described, from which it can be seen that the chip has the complete range of capabilities that are needed for the chip to function as a dynamic random access memory device (dRAM). The chip of the invention is very suitable for very large scale integration (VLSI), for the following reasons:

1. The chip of the invention is of the category that uses a non-destructive READ operation, i.e. there is no alternation of the logic signal during READ.

2. The cell is of comparatively simple construction, compared with the cells of other proposed or actual dRAM chips. The number of masks required during manufacture of the chip is therefore kept low, which means that comparatively few of the manufactured chips will be faulty.

3. In the cell of the invention, the various layers and regions are disposed in a vertically-stacked manner. This may be contrasted with other designs, where the devices are disposed on the surface of the substrate material. This vertical-stacking of the components in the invention has two benefits: first, there is the geometrical benefit that the overall area, in plan view of the cell, is at a theoretical minimum, in that the plan view includes only those three components to which the lines are connected, and no more; secondly, there is the functional benefit that the n-well is buried, which improves the cell's immunity to soft-errors. Soft errors are caused by slightly radioactive materials placed near the cell: the radioactivity releases alpha particles from the substrate, but in the invention these particles are diverted away from the capacitor—where they might cause the capacitor to shed its charge—by the buried n-well.

4. The devices that are included in the cell of the invention are themselves simple, and are simple to manufacture. There are no critical shapes that the regions need to have, and the components can all be provided substantially without the need for compromises between them or the need for a balancing of properties. In the invention, there are few design constraints and, especially, there are few constraints on those components of the cell that are vulnerable through being placed on the surface of the substrate.

5. Another benefit arises from the fact that, in the invention, the devices do not operate on the surface of the substrate, and that it is possible to increase the voltage supplied to the top plate of the capacitor. In the invention, the limit on the RITE BIT-LINE is set by the breakdown voltage of the oxide layer of the capacitor, which is a much looser limit than would be imposed by critical surface-operating devices. This freedom to increase the WRITE voltage becomes important as the cell is scaled down.

6. One of the main considerations in the design of a very small memory cell, of course, is to utilise what little space is available to the best advantage. In particular, this means that the area of the capacitor plates should occupy as much as possible of the area of the whole cell. In the invention, it will be noted, the electrical demands on the capacitor are low, so that the stored charge and hence the capacitor itself, can be small; and besides that, the capacitor does occupy a large proportion of the plan-area of the cell. Both these factors are important in allowing the cell to be scaled down, yet still perform adequately.

7. In the chip of the invention—as in other dRAM chips—it is necessary to provide on the chip both nMOS and pMOS transistors arranged complementarily; not as part of the cells, but as part of the peripheral circuitry. If the chip has a p-substrate, then it is a simple matter to form the pMOSFETs, simply by forming n+ pockets in the substrate to act as source and drain. The nMOSFETs, on the other hand, have to be formed by first providing a localised n-well in the p-substrate, and then adding p+ pockets in the n-well. It is a known factor of this technology (CMOS technology) that the localised n-well must extend deep down into the substrate. If the n-well were to be shallow, then there might be only a short distance between the p+ pocket and the p-substrate. The smaller the thickness of the intervening n-material, the more likely it is that the n-material could become the base of a parasitic p-n-p bipolar transistor. To avoid this possibility, if complementary MOS transistors are being provided on the chip, it is necessary that the n-wells be deep. The invention does not require the use of shallow n-wells. In the invention the n-well that forms the channel of the JFET can be just as deep as the n-wells that are commonly produced when providing CMOS transistors. Hence, in the invention, no extra masking or diffusing operations are required, as would be needed if n-wells of different depths were called for. The chip of the invention may therefore be regarded as being highly compatible with the conventional CMOS technology, a feature which is not present with many dRAM designs.

On the other hand, the depth of the channel 35 between the two p-regions 32, 37 can be kept small, even though the n-well is deep, by controlling the depth of the p-region 32. Thus, in the chip of the invention, there is no parasitic p-n-p transistor action in the complementary MOS transistors on the chip, and yet the p-n-p bipolar transistors in the memory cells can operate adequately because the base of these transistors can be kept thin. The n-channel 34 not only serves as the base of the bipolar transistor, but also as the channel of the JFET; the n-channel requires to be thin for both of these functions, so no compromise is required in that regard, in the invention.

8. When the cell is made smaller, the capacitance of the capacitor inevitably also is smaller. But in the invention the current that flows in the READ BIT-LINE during a READ operation is merely controlled by the cell capacitance, not generated by it. Hence the signal current can be large, even though the cell capacitance is small.

9. Another important aspect of performance of a VLSI chip is its speed of operation. In the invention, the MOS capacitor of the cell is charged and discharged through the bipolar transistor. A bipolar transistor can cope with large current flows if its biassing is properly controlled; in the invention, the biassing of the bipolar transistors is done on the WORD-LINEs which, during a WRITE operation, can be dedicated specifically to the biassing function. Hence, a high writing speed is achievable, both to charge and to discharge the capacitors of the cells.

A nondestructive READ operation does not require a re-write operation, which also keeps the read time short.

The relatively large voltage swings that can be achieved at the input to the sense-amplifier, in the invention, means that the differential voltage on the sense-amplifier takes only a short time to become established, which also keeps the read time short.

The chip described above was built on a substrate of p-doped material. Whilst this is commonly the case, there is no reason why n-doped material could not be used as the substrate; if so, the p and n doping as described would be reversed and the polarities of the various voltages would be reversed, in the conventionally known manner. It should also be noted that the cell of the invention may be regarded as symmetrical, in that the source and drain are inter-changeable.

In this specification, the term "polarity" is used in relation to voltages, and the term "polarity" is used also in relation to conductivity types. In relation to voltages, the polarity of a voltage refers to whether the voltage is positive or negative. In relation to conductivity types, the expression "doped to positive (or negative) polarity of conductivity" means "doped to p-type (or n-type) conductivity".

Where, in this specification, an applied voltage is stated as being required to be of the same polarity as the conductivity-polarity to which a particular region has been doped, this means that if the region has been doped p-type, the applied voltage is required to be positive, and if the region has been doped n-type, the applied voltage is required to be negative.

We claim:

1. Dynamic memory or storage cell, for uses in an integrated circuit chip, wherein:
   the cell includes a cell-substrate, which is doped to a first polarity of conductivity;
   the cell includes a source, a drain, and a channel-diffusion;
   the channel-diffusion extends between the source and the drain;
   the channel-diffusion is formed as a diffusion into the substrate, and is doped to the opposite polarity of conductivity to the substrate;
   the cell includes a gate;
   the cell is so arranged and disposed that the channel diffusion is sandwiched between the cell-substrate and the gate, whereby the source, drain, channel-diffuion and gate comprise an opposite-polarity-channel junction-gate field-effect transistor (JFET);
   the cell includes an emitter means;
   the cell-substrate, the channel-diffusion, and the emitter means are so arranged and disposed in the cell as to comprise the collector, base, and emitter respectively of a bipolar transistor;
   the cell includes an upper plate, a lower plate, and an insulation means for insulating the two plates;
   the plates and the insulation means are so arranged and disposed in the cell as to comprise a capacitor;
   and the cell includes a voltage-equalizing means for maintaining the gate, the emitter means, and the lower plate always at the same voltage as each other.

2. Cell of claim 1, which further includes:
   a ground means for applying a ground voltage to the cell-substrate;
   a write bit-line means for applying to the upper plate selectably either the ground voltage, or a voltage of the said opposite polarity relative to the cell substrate;
   a word-line means for applying to the source selectably either the ground voltage, or a voltage of the said opposite polarity;
   a read bit-line means, for selectably either applying to the drain a voltage of the said first polarity, or for carrying a current flowing through the drain.

3. Integrated circuit chip, which includes many cells, each of which is a cell as claimed in claim 2, wherein:
   the cells of the chip are arranged in rows and columns;
   the chip includes respective write bit-lines, one write bit-line to each column of cells;
   the chip includes respective word-lines, one word-line to each row of cells;
   the chip includes respective read bit-lines, one read bit-line to each column of cells;
   the respective write bit-line means of the cells that comprise one such column of cells being connected to the respective write bit-line of that column;
   the respective word-line means of the cells that comprise one such row of cells being connected to the respective word-line of that row;
   the respective read bit-line means of the cells that comprise one such column of cells being connected to the respective read bit-line of that column;
   the chip includes a means for applying independently to the respective write bit-lines selectably either ground voltage or voltage of the said oppposite polarity to the cell substrate;
   the chip includes a means for applying independently to the respective word-lines selectably either ground voltage or voltage of the said opposite polarity;

the chip includes respective sense amplifiers, one sense amplifier to read bit-line;

and the chip includes a means for selectably either applying a voltage of the said first polarity to the respective read bit-lines, or carrying currents flowing in the respective read-bit lines to the respective sense amplifiers.

4. Chip of claim 3, where each cell is provided with no connecting lines other than the respective write bit-line, word-line, and read bit-line.

5. Chip of claim 3, where the sources are connected in rows each to the respective word-line;

where the drains are connected in columns each to the respective read bit-line appropriate to that column;

and where the upper plates of the capacitors of the said cells are connected in corresponding columns each to the respective write bit-line.

6. Chip of claim 5, which includes means for writing an input logic state into a selected one of the said cells, comprising:

a sensing means;

where the sensing means is effective first to sense the logic states of all the cells in the row containing the selected cell;

and is then effective to change the stored logic state appropriate to the selected cell to the input logic state, and to leave the stored logic states appropriate to the unselected cells unchanged;

and is then effective to write the logic states as now stored in the sensing means into the respective cells in the row.

7. Chip of claim 6, which includes means for ensuring that only the logic states of the cells in the row containing the selected cell are sensed into the sensing means, the said means comprising:

means for holding the read bit-lines, and hence the JFET drains of all the cells at a positive voltage;

means for holding the word-lines of the unselected rows at a positive voltage, thereby to hold the sources of the JFETs of the said cells in the unselected rows at the positive voltage, and thereby to switch off the bipolar transistors of the cells in the unselected rows.

8. Chip of claim 7, where the said positive voltage is between 2 and 5 volts above ground voltage and where the voltage of opposite polarity is a negative voltage of between 2 and 5 volts below ground voltage.

9. Chip of claim 8, where the positive voltage is 2.5 Volts above ground voltage, and where the negative voltage is 2.5 Volts below ground voltage.

10. Chip of claim 5, which includes means for reading the logic state of a selected cell, comprising:

sense amplifiers which are connectable one each to the respective read bit-lines;

a respective means for applying a reference voltage to each sense amplifier;

a respective means for latching each sense-amplifier;

where the sense amplifier is effective to compare the voltage in the read bit-line with the reference voltage, and to adopt an "on" or "off" condition depending on whether the read bit-line voltage is higher or lower than the reference voltage.

11. Chip of claim 10, which includes a respective means for disconnecting the read bit-lines and the means for applying the reference voltage from the sense amplifier;

where the arrangement of the chip is such that, after the sense amplifier is latched in the appropriate condition, the said means is effective then to remove the read bit-line and the means for applying the reference voltage from the sense-amplifier.

12. Chip of claim 11, which includes a storage buffer, and a means for routing the condition of the sense amplifier into the storage buffer, where the arrangement of the chip is such that the said means is effective to route the condition of the sense amplifier to the storage buffer after the sense amplifier becomes latched.

13. Chip of claim 12, which includes means for holding all the write bit-lines to a negative voltage;

and means for placing the word line of the row of cells containing the selected cell to ground voltage, while holding the word lines of all the other rows at a positive voltage.

14. Chip of claim 12, where the sense amplifier comprises two field-effect transistors (FETs);

where the drain of one of the FETs is connected to the appropriate read bit-lines and the drain of the other FET is connected to the means for applying the reference voltage;

where the gates of the two FETs are connected together and set at an appropriate voltage to enable the FETs.

15. Chip of claim 3, where the read bit-lines are formed as heavily doped n-material which extends along the columns of cells.

16. Chip of claim 3, where the write bit-lines comprise conductive polysilicon material, intercalated with the read bit-lines, and each write bit-line comprises the gates of all the cells in the respective column.

17. Chip of claim 3, where the word lines are formed as respective overlays of metal, the sources of all the cells in one row, being connected to a respective one of the word lines.

18. Chip of claim 27, where the sources of cells in one of the rows are in the form of n-doped regions, each of the said n-doped regions comprising the combined sources of two adjacent cells of the same row, and where only one connection per said region is made to the metal of the word-line.

19. Cell of claim 1, wherein:

the voltage equalizing means comprises the arrangement, in combination, of the gate, the emitting means, and the lower plate together as a single unitary diffusion, in the cell;

and the diffusion is doped to the first polarity of conductivity.

20. Cell of claim 19, wherein the components of the cell comprise a vertical stack of layers, arranged in the following sequence:

at the bottom of the cell, the said first-polarity cell-substrate;

next above that, the said opposite-polarity channel-diffusion;

next above that, the said first-polarity single unitary diffusion;

next above that, the said insulation means;

and next above that, the said upper plate.

21. Cell of claim 20, wherein:

the source and drain are arranged laterally to the sides of the said stack, and comprise respective regions that are heavily doped to the said opposite polarity of conductivity.

22. Cell of claim 20 where the said layers are contiguous with adjacent layers, in the order named.

* * * * *